(12) United States Patent
Azdasht

(10) Patent No.: US 7,106,599 B2
(45) Date of Patent: Sep. 12, 2006

(54) CHIP MODULE AND CHIP CARD MODULE FOR PRODUCING A CHIP CARD

(75) Inventor: Ghassem Azdasht, Berlin (DE)

(73) Assignee: Smart Pac GmbH Technology Services, (DE)

( * ) Notice: Subject to any disclaimer, the term of this patent is extended or adjusted under 35 U.S.C. 154(b) by 130 days.

(21) Appl. No.: 10/432,651

(22) PCT Filed: Nov. 14, 2001

(86) PCT No.: PCT/DE01/04243

§ 371 (c)(1),
(2), (4) Date: Nov. 6, 2003

(87) PCT Pub. No.: WO02/42996

PCT Pub. Date: May 30, 2002

(65) Prior Publication Data

US 2004/0080902 A1    Apr. 29, 2004

(30) Foreign Application Priority Data

Nov. 27, 2000  (DE) ............................... 100 58 804

(51) Int. Cl.
*H05K 7/02* (2006.01)
(52) U.S. Cl. .................................................... 361/783
(58) Field of Classification Search ................ 361/767, 361/768, 737, 782, 783
See application file for complete search history.

(56) References Cited

U.S. PATENT DOCUMENTS

| | | | |
|---|---|---|---|
| 5,880,934 A * | 3/1999 | Haghiri-Tehrani | 361/737 |
| 6,049,461 A * | 4/2000 | Haghiri-Tehrani et al. | 361/737 |
| 6,259,408 B1 * | 7/2001 | Brady et al. | 343/700 MS |
| 6,459,588 B1 * | 10/2002 | Morizumi et al. | 361/737 |
| 6,607,135 B1 * | 8/2003 | Hirai et al. | 235/487 |
| 6,882,545 B1 * | 4/2005 | Akita et al. | 361/767 |
| 2003/0016506 A1 * | 1/2003 | Fujii | 361/737 |

* cited by examiner

*Primary Examiner*—Kamand Cuneo
*Assistant Examiner*—Yuriy Semenenko
(74) *Attorney, Agent, or Firm*—Adams Evans P.A.

(57) ABSTRACT

The invention pertains to a chip module 20 and a method for producing a chip card module that comprises a chip module with a chip carrier 21 and a chip 22 that is contacted with strip conductors 25, 26 of the chip carrier, wherein the chip carrier comprises a flexible carrier material and the strip conductors respectively extend over the length of the carrier substrate, and wherein the chip carrier 21 contains two longitudinal regions 35, 36 of identical length which are offset relative to one another in the longitudinal direction of the chip carrier and respectively assigned to one strip conductor 25, 26.

8 Claims, 4 Drawing Sheets

Figure 1:
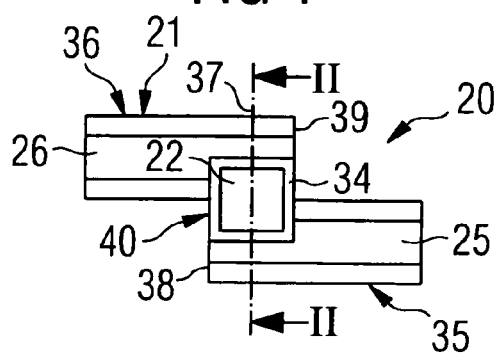

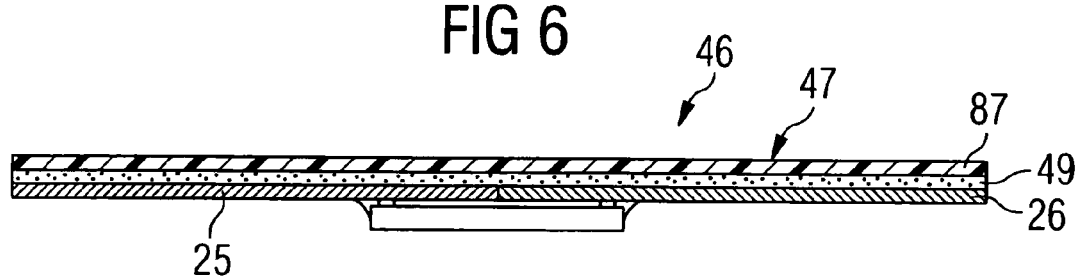
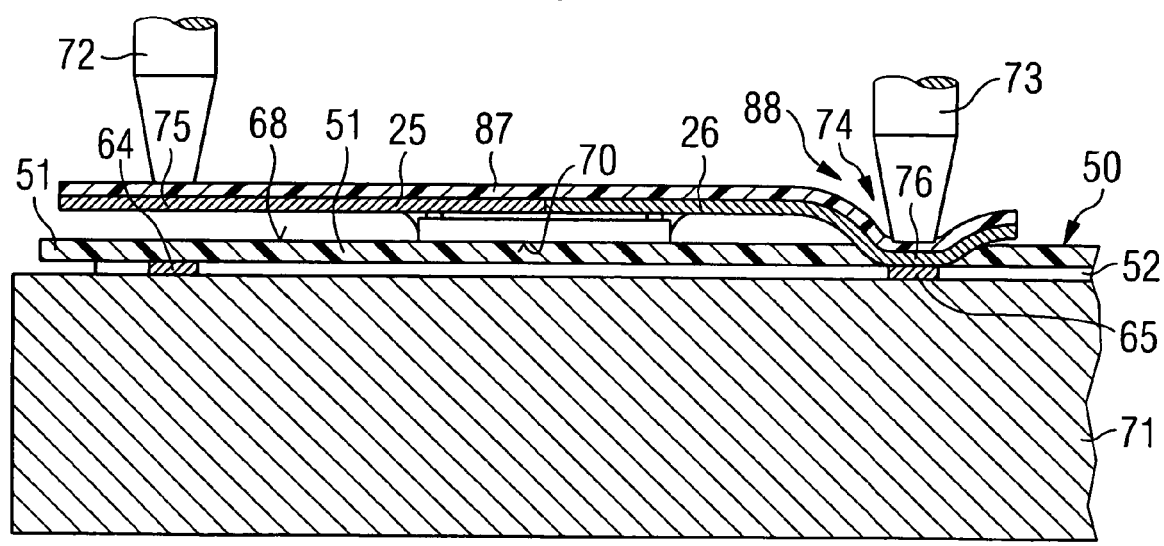

CHIP MODULE AND CHIP CARD MODULE FOR PRODUCING A CHIP CARD

This application is a national stage application, according to Chapter II of the Patent Cooperation Treaty.

The present invention pertains to a chip module with a chip carrier and a chip that is contacted with strip conductors of the chip carrier, wherein the chip carrier comprises a flexible carrier substrate and the strip conductors respectively extend over the length of the carrier substrate. The invention also pertains to a chip card module that is provided with a chip module of the aforementioned type, as well as to a method for producing such a chip card module according to the preamble of claim 7.

Chip cards that allow contactless access to the storage data of the chip contain a so-called transponder unit that comprises a chip and an antenna coil that is contacted with the chip. In the production of such chip cards, in order to prepare the chip for the contacting with the contact ends of the coil that is arranged on a coil substrate, it is common practice to arrange the chip on a chip carrier with contact surfaces that are enlarged in comparison with the chip contact surfaces for the contacting with the contact ends of the coil. Such chip modules that are composed of the chip and the chip carrier are normally arranged in the interior of the coil. In order to contact the coil contact ends with the chip module, it is necessary to cross the coil section with the end region of the outer coil winding so as to be able to arrange both coil contact ends of the coil in the interior of the coil. Alternatively, the chip module or the chip carrier of the chip module, respectively, needs to be realized such that one winding section of the coil is traversed so as to be able to connect the contact ends of the chip carrier to the outer and the inner coil contact ends. This means that it is either necessary to provide an electrically insulated strip conductor bridge of the winding section or to realize the chip carrier in the form of an elongated and consequently large-surface structure. The latter, in particular, contradicts the current miniaturization attempts with respect to chip cards.

A chip module and a method for producing a chip card module according to the preambles of claims 1 and 7 are known from EP-A-0 992 939. This known chip module comprises a flexible carrier substrate with strip conductors that extend over the length of the carrier substrate. The carrier substrate has a rectangular shape, wherein the chip is arranged in the region of one longitudinal end of the carrier substrate and the strip conductors extend to the opposite longitudinal end of the carrier substrate. In order to contact the chip module with the coil module, the known method proposes to arrange an insulating separation layer between the strip conductors of the chip module and the coil metallization in a separate production step.

A chip module and a method for producing the chip module in accordance with the "flip-chip technique" are known from DE-C1-195 32 755.

Consequently, the invention is based on the objective of making available a chip module and a chip card module for producing a chip card which allow a direct contacting of an outer and an inner coil contact region, namely without requiring a large-surface chip carrier. Another objective of the invention consists of proposing a method for producing such a chip card module.

These objectives are attained with a chip module with the characteristics of Claim 1 and a chip card module with the characteristics of claims 4 or 5.

The chip module according to the invention comprises a chip carrier with two longitudinal regions of identical length which are offset relative to one another in the longitudinal direction of the chip carrier and respectively assigned to one strip conductor.

According to the aforementioned characteristics, the chip carrier and the carrier substrate have an essentially Z-shaped design with a chip contact region formed in a central area and with two longitudinal regions that respectively extend to one side of a central axis and transform into one another in the central area. Due to the Z-shaped design of the chip carrier, a comparatively long longitudinal extent is achieved while the surface of the chip carrier is maintained relatively small. This means that great contacting distances can be traversed with the two strip conductors of the chip carrier that are respectively assigned to one chip contact surface.

In order to realize a comparatively simple design of the chip module, it is advantageous that the chip is contacted on the chip carrier such that its contact surfaces face the strip conductors. This is preferably realized in accordance with the flip-chip technique, in which the chip contact surfaces are directly contacted on the strip conductor of the carrier substrate without the utilization of additional strip conductors.

In a first embodiment, the chip card module according to the invention which is provided with a chip module of the aforementioned type has a structure, in which the chip module is contacted on a coil module that comprises a coil substrate and a coil arranged on the coil substrate, namely such that the rear side of the chip is arranged on the coil substrate and the strip conductors of the chip module are contacted with the rear side of the coil contact ends of the coil.

The chip card module according to the invention consequently comprises an arrangement, in which the chip is situated in a central position of a sandwich-like structure between the chip carrier of the chip module and the coil substrate of the coil module, namely in an outwardly protected pocket-like or cushion-like receptacle. This means that an encapsulation of the chip as a protection against external influences can be eliminated.

According to another embodiment of the invention, the chip card module has a structure, in which the chip module is contacted on a coil module that comprises a coil substrate and a coil arranged on the coil substrate, namely such that the carrier substrate of the chip module is arranged opposite of the coil and the strip conductors are contacted with the upper side of the coil contact ends of the coil.

This results in a structure of the chip card module, in which an insulating cover of the coil—for example, by applying an insulating laminate layer—can be eliminated despite the direct contacting of the strip conductors of the chip module with the coil contact ends of the coil.

It has proved particularly advantageous in both variations of the chip card module according to the invention that the chip module is arranged on the coil module in such a way that the chip carrier with its strip conductors transversely extends over one winding section of the coil and the outer contact ends of the strip conductors are respectively contacted with one inner and one outer coil contact end.

This results in a chip card module, in which a simple manufacture and a high technical reliability of the chip card module are ensured with a minimal material requirement for the chip module and the simplest possible coil configuration with one inner and one outer coil contact end.

In the method according to the invention for producing a chip card module, the chip module and the coil module are arranged on top of one another in a first production step, namely such that the carrier substrate or the coil substrate forms an insulating separation layer between the strip conductors and the coil and the contact ends of the strip conductors are situated congruently with the coil contact ends of the coil. In an ensuing production step, the contact ends of the strip conductors are subjected to temperature and pressed against the coil contact ends such that an intermediate contact material that is formed by the separating layer and arranged between the contact ends of the strip conductors and the coil contact ends is simultaneously displaced.

In one advantageous variation of this method, the separation layer is formed by the coil substrate, and the rear side of the contact ends of the strip conductors is subjected to pressure by means of the carrier substrate while the carrier substrate is simultaneously compressed in a contact zone.

Figure 2:
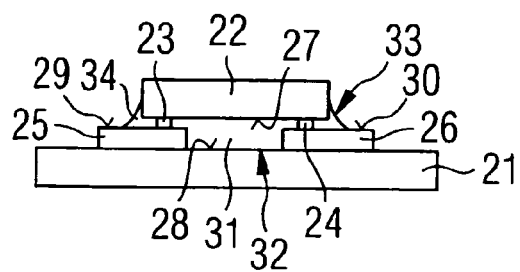
Figure 3:
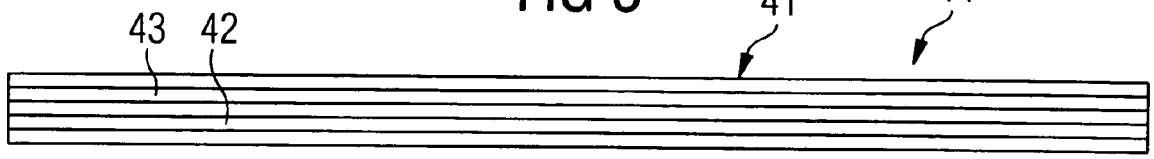
Figure 4:
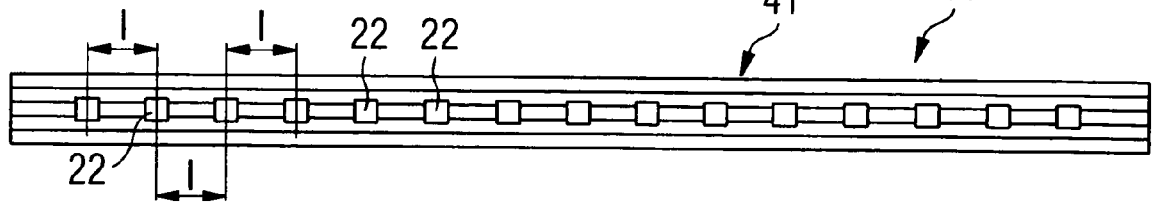
Figure 5:
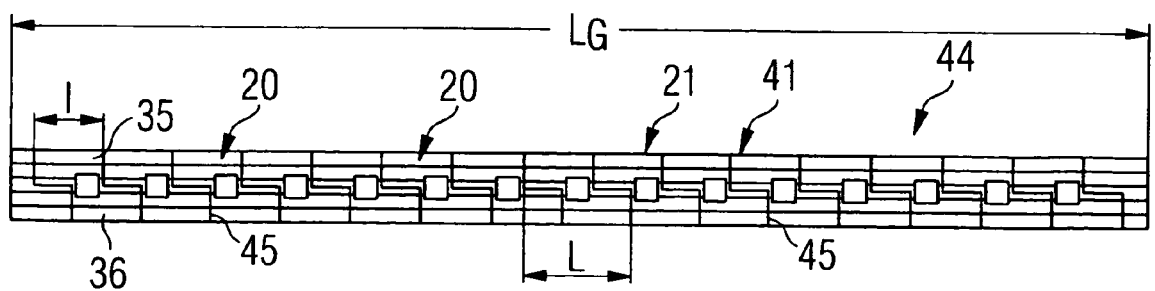
Figure 8:
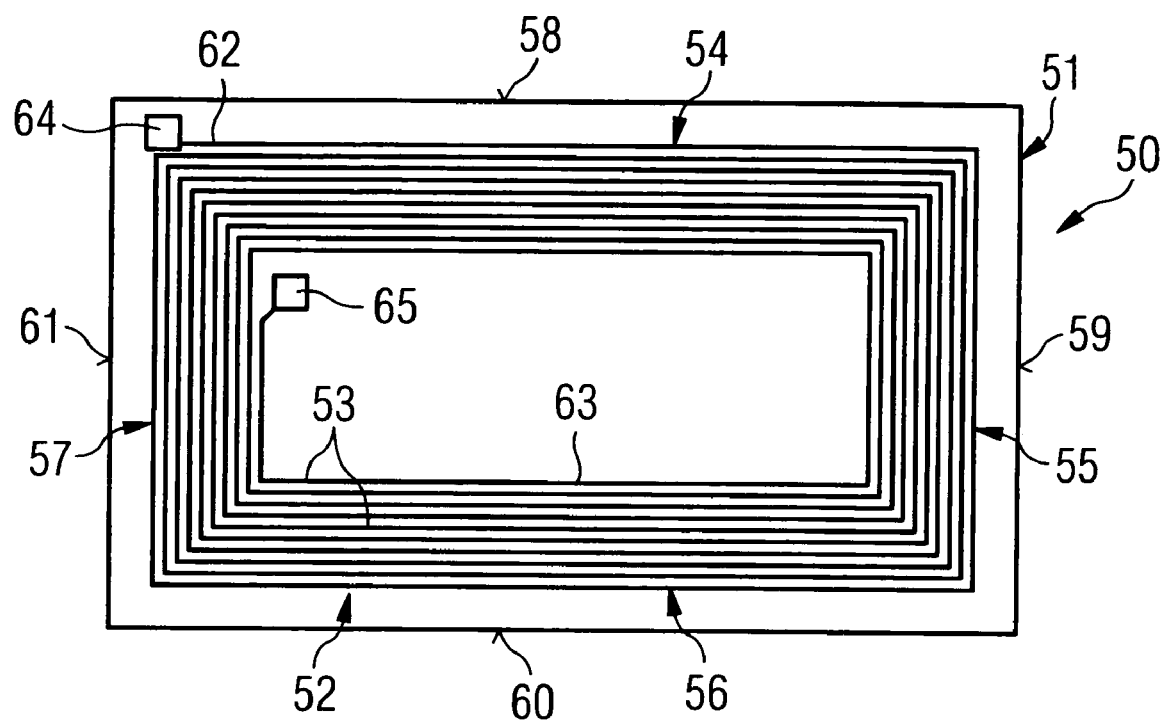
Figure 9:
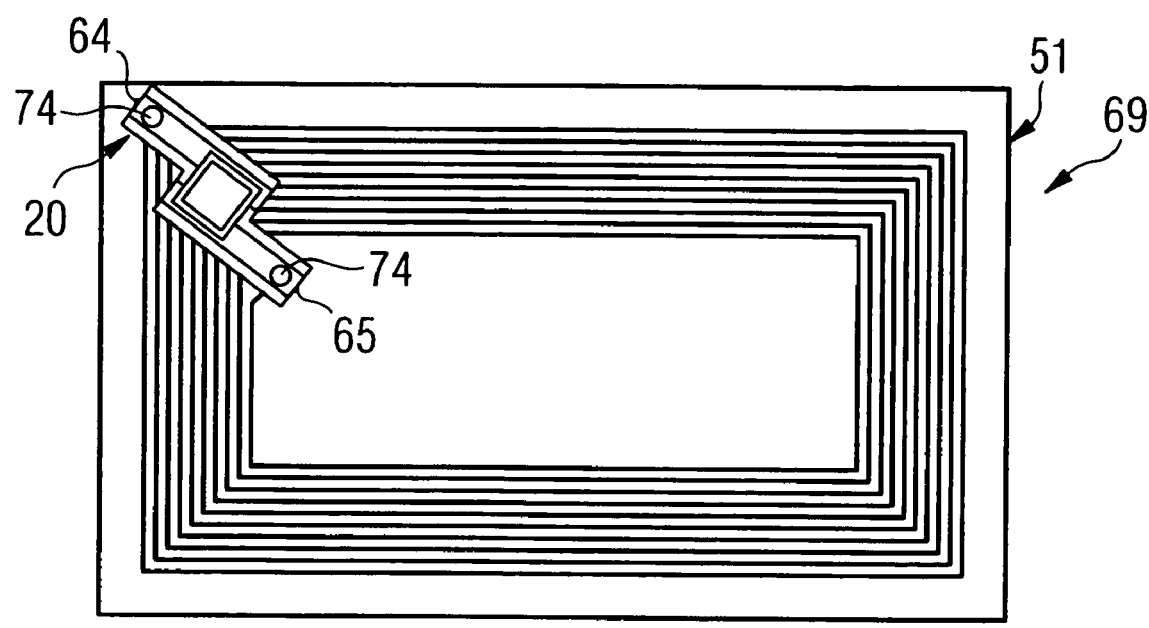
Figure 10:
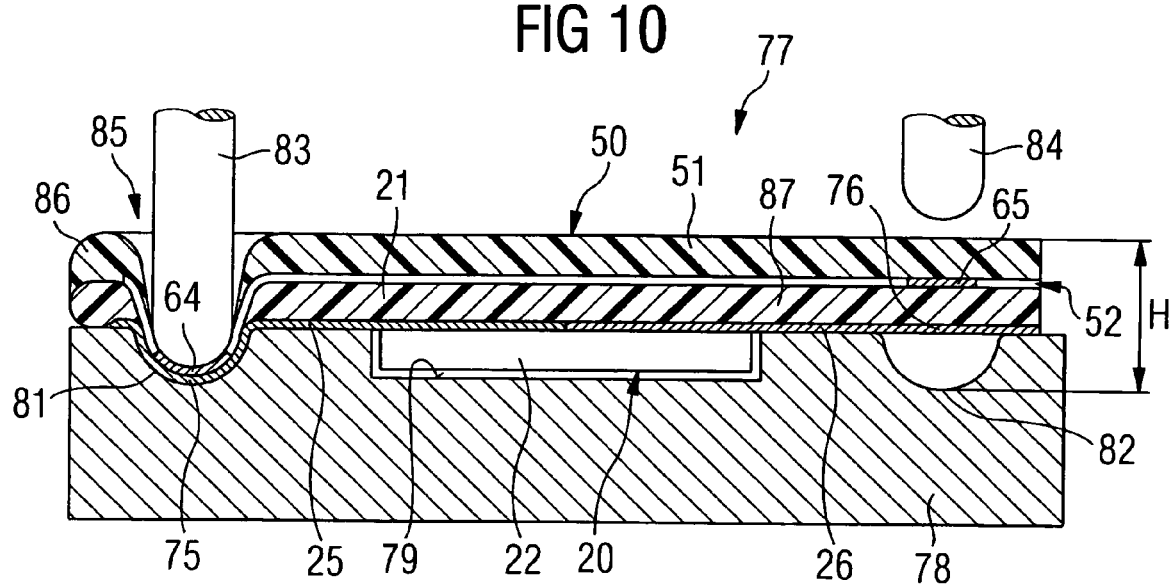

One preferred embodiment of the chip module, as well as two embodiments of the chip card module, are described in greater detail below with reference to the drawings. The drawings show:

FIG. 1 a chip module in the form of a top view;

FIG. 2 the chip module shown in FIG. 1 in the form of a cross section along the line of section II—II in FIG. 1;

FIG. 3 an endless substrate that is provided with strip conductors and serves for producing the chip module shown in FIG. 1;

FIG. 4 the endless substrate shown in FIG. 3 after the flip-chip contacting with chips;

FIG. 5 the endless substrate shown in FIG. 4 which is provided with chips, namely after its segmenting in order to produce interconnected chip modules;

FIG. 6 another embodiment of the chip module in the form of a side view;

FIG. 7 the chip module shown in FIGS. 1 and 2 during the contacting with a coil module in order to produce a chip card module;

FIG. 8 the coil module shown in FIG. 7 in the form of a top view;

FIG. 9 the coil module shown in FIG. 8 after the contacting with a chip module in order to produce a chip card module;

FIG. 10 another embodiment of a chip card module, and

Figure 11:
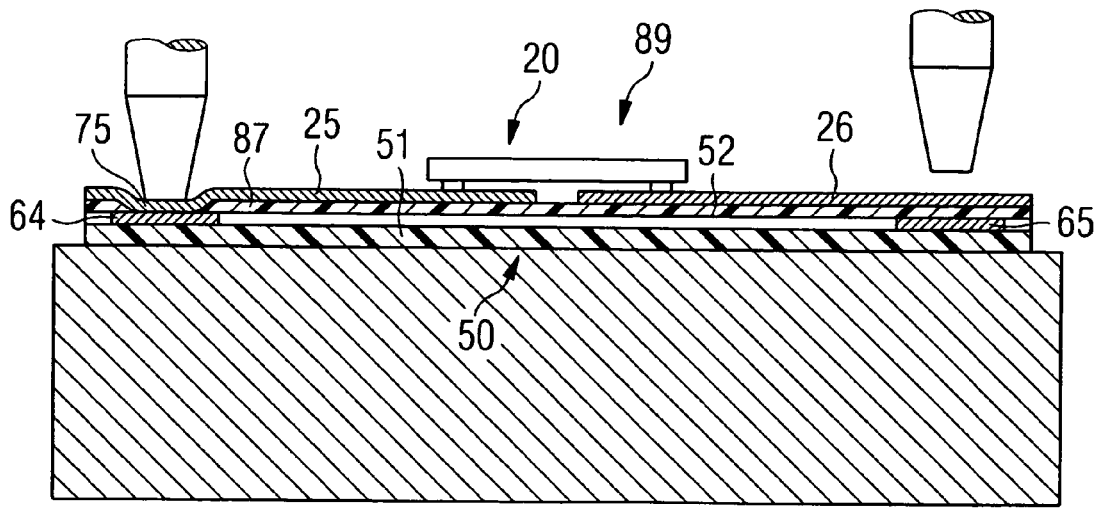

FIG. 11 yet another embodiment of a chip card module.

FIG. 1 shows a chip module 20 with a chip 22 that is arranged on a chip carrier 21 and contacted with strip conductors 25, 26 of the chip carrier 21 by means of its contact surfaces 23, 24 shown in FIG. 2. FIG. 2 also shows that an intermediate space 31 between a chip contact side 27 and a surface 28 of the chip carrier 21 or the upper side 29, 30 of the strip conductors 25, 26 is filled with an underfiller 32. The underfiller 32 simultaneously seals a peripheral gap 33 with a border 34.

FIG. 1 also shows that the chip carrier 21 contains two longitudinal regions 35 and 36 that are offset relative to one another in the longitudinal direction and form a central area 40 with adjacently arranged inner end regions 38, 39, namely in the region of a central axis 37 that extends transverse to the longitudinal direction. The chip 22 is contacted with the chip carrier 21 or with the strip conductors 25, 26 that respectively extend over the longitudinal regions 35, 36 in said central area 40.

Since the longitudinal regions 35, 36 of the chip carrier 21 are realized such that they transform into one another with their inner end regions 38, 39 in the central area 40 and otherwise extend in opposite directions, the chip carrier 21 essentially has a Z-shaped design if it is viewed from the top.

FIGS. 3 to 5 show successive production steps for elucidating the production of chip modules of the type shown in FIG. 1.

FIG. 3 shows an endless substrate 41 with endless strip conductors 42, 43 that are arranged on the surface of the endless substrate 41 and extend parallel to one another in the longitudinal direction of the endless substrate 41. The endless substrate 41 forms an endless chip carrier 44 together with the endless strip conductors 42, 43.

FIG. 4 shows the endless chip carrier 44 that this provided with chips 22 within equidistant intervals 1, wherein the chips are contacted with the endless strip conductors 42, 43 by means of their contact surfaces 23, 24 as shown in FIG. 2.

FIG. 5 shows the endless chip carrier 44 after it has been segmented by means of punching lines 45, wherein individual chip carriers 21 of the type and surface structure shown in FIG. 1 are defined by said punching lines 45. The offset longitudinal regions 35, 36 that are arranged such that they transform into one another and collectively form the chip carrier 21 respectively have the length l.

The Z-shaped surface structure of the individual chip carriers 21 makes it possible to arrange the chip carriers 21 such that they are nested into one another. This means that, referred to the total length $L_G$ of the endless substrate 41, a significantly larger number of individual chip carriers 21 with the length L can be manufactured from the endless chip carrier 44 than in instances in which the chip carrier is not realized in the form of a Z, but rather conventionally with a rectangular shape.

FIGS. 1 and 5 also clearly indicate that, due to the Z-shaped design of the chip carriers 21, a maximum length L of the chip carriers 21 can be achieved with a minimal material requirement while simultaneously realizing a sufficiently large surface for contacting the chip 22 in the central area.

FIG. 6 shows a side view of a chip module 46 that merely differs from the embodiment shown in FIG. 1 with respect to its chip carrier 47. Instead of directly arranging the strip conductors 25, 26 on the chip carrier 21 (FIG. 1), an adhesive layer 49 is situated between the strip conductors 25, 26 and a carrier substrate 87 in the embodiment according to FIG. 6.

Due to the transparent illustration of the coil substrate 51 in FIGS. 7 and 8, the coil 52 arranged on the rear side is also visible in FIGS. 7 and 8.

FIG. 7 shows the chip module 20 according to FIG. 1 during the connection process for connection to a coil module 50 in order to produce a chip card module 69. The coil module 50 has a coil 52 that is arranged on a coil substrate 51 as it is also illustrated in FIG. 8.

FIGS. 8 and 9 show that the coil 52 comprises a series of coil windings 53 that, in the embodiment shown, are arranged on the coil substrate 51 in such a way that they respectively extend parallel to the outer edges 58, 59, 60 and 61 of the coil substrate 51 in the form of four winding sections 54, 55, 56 and 57. An outer coil winding 62 and an inner coil winding 63 respectively lead to a coil contact end 64, 65 that serves for the contacting with the strip conductors 25, 26 of the chip carrier 21 (FIG. 2).

FIG. 7 shows that, in order to produce the chip card module 69, the chip module 20 is arranged on the coil module 50 in such a way that the chip 22 adjoins a substrate surface 68 of the coil substrate 51 with its rear side 70 and the coil 52 with the coil contact ends 64, 65 is situated on the rear side of the coil substrate 51 which faces away from the chip 22. In order to produce the contacts, the coil module 50 lies on a pressure pad 71 and contacting rams 72, 73 of a not-shown contacting device are arranged on the coil substrate 51 in accordance with the coil contact ends 64, 65, wherein said contacting rams are moved against the contact ends 75, 76 of the strip conductors 25, 26 of the chip carrier 21 in order to produce a through-contact 74. A mechanically durable and electrically conductive connection between the strip conductors 25, 26 and the coil contact ends 64, 65 can be produced, for example, by simultaneously acting upon the contacting rams 72, 73 with pressure and temperature and/or ultrasound. For example, the right through-contact 74 in FIG. 7 indicates that the contact end 76 is deformed against the coil contact end 65 in a contact zone 88 during this process, namely while simultaneously displacing an intermediate contact material, e.g., polyvinyl chloride, that is formed of the coil substrate 51 in this embodiment and can be deformed more easily than the material of the carrier substrate 87, e.g., polyimide. Since the rear side of the contact end 76 of the strip conductor 26 is simultaneously subjected to pressure, the carrier substrate 87 is compressed in the region of the contact zone 88.

FIG. 9 shows the finished chip card module 69 in the form of a top view, comprising the chip module 20 that is arranged on the coil substrate 51 and contacted with the coil contact ends 64, 65 on the rear side of the coil substrate 51 by means of the through-contacts 74.

FIG. 9 indicates that the Z-shaped chip module 20 extends over the entire width of the windings of the coil 52.

FIG. 10 shows the production of a chip card module 77 that, analogous to the chip card module 69, is composed of a chip module 20 and a coil module 50. In contrast to the chip card module 69 shown in FIG. 7, the chip card module 77 shown in FIG. 10 has a modified structure, in which the coil module 50 faces the carrier substrate 87 of the chip module 20 with its coil 52 that is arranged on the coil substrate 51.

In order to produce the chip card module 77, the chip module 20 is arranged on a pressure pad 78 such that its chip 22 faces the pressure pad 78 and the chip 22 is situated in a chip receptacle 79 of the pressure pad 78. Except for the contact ends 75, 76, the strip conductors 25, 26 of the chip carrier 21 lie on a contact surface of the pressure pad 78. In the region of the contact ends 75, 76, the pressure pad 78 contains depressions 81, 82, wherein contacting rams 83, 84 are arranged opposite of these depressions such that the arrangement consisting of the coil substrate 51 and the chip module 20 is situated between the contacting rams 83, 84 and the depressions 81, 82 in the region of the contact ends 75, 76.

FIG. 10 shows the production of a left through-contact 85, wherein the contacting ram 83 is displaced in the direction of the depression 81 while simultaneously being subjected to pressure and temperature and/or ultrasound. If the coil substrate 81 and the carrier substrate 87 consist of suitable materials, for example, PVC in both instances, the dielectric material of the coil substrate 51 and the carrier substrate 87 of the chip carrier 21 is displaced and/or evaporated, wherein the displaced material forms an outer bead 86 in the embodiment shown.

A comparison between the through-contact 85 (FIG. 10) and the through-contact 74 (FIG. 7) clearly indicates that a stronger positive connection between the contact ends 75, 76 of the chip carrier 21 and the coil contact ends 64, 65 of the coil 52 is achieved in the through-contact 85 due to the contacting method that is practically realized in the form of a deep-drawing process. FIG. 10 also shows that this type of through-contacting which proves particularly reliable in practical applications is achieved without causing a disadvantageous increase in the total height H of the chip card module 77.

FIG. 11 shows another chip card module 89 that comprises a chip module 20 and a coil module 50, wherein the carrier substrate 87 of the chip carrier 21 serves as an insulating separation layer between the strip conductors 25, 26 and the coil 52. In this case, the coil substrate 51 consists of a material that is particularly resistant to deformation, for example, an artificial resin. The carrier substrate 87, in contrast, consists of a relatively soft material, for example, polyimide or PVC. This means that a complete displacement of the carrier substrate 87 takes place in the region of the contact zone 88 when the contact end 75 is subjected to pressure and the coil substrate 51 is essentially not compressed.

The invention claimed is:

1. A chip module with a chip carrier and a chip that is contacted with strip conductors of the chip carrier, wherein the chip carrier comprises a flexible carrier substrate and the strip conductors respectively extend over the length of the carrier substrate, characterized in that the chip carrier contains two longitudinal regions of identical length which are offset relative to one another in the longitudinal direction of the chip carrier and respectively assigned to one strip conductor, the carrier and the chip substrate having an essentially Z-shaped design with a chip contact region formed in a central area and with the longitudinal regions respectively extending to one side of a central axis and transforming into one another in a central area forming the chip contact region.

2. The chip module according to claim 1, characterized in that the chip is contacted on the chip carrier such that its contact surfaces face the strip conductors.

3. The chip module according to claim 2, characterized in that the chip is contacted on the chip carrier in accordance with the flip-chip technique.

4. A chip card module for producing a chip card with the chip module according to one of claims 1–3, characterized in that the chip module is contacted on a coil module that comprises a coil substrate and a coil arranged on the coil substrate in order to form the chip card module, namely such that the rear side of the chip is arranged on the coil substrate and the strip conductors of the chip module are contacted with the rear side of coil contact ends of the coil, the chip module being arranged on the coil module in such a way that the chip adjoins a substrate surface of the coil substrate with its rear side and the coil with the coil contact ends is situated on the rear side of the coil substrate which faces away from the chip.

5. A chip card module with the chip module according to one of claims 1–3, characterized in that the chip module is contacted on a coil module that comprises a coil substrate and a coil arranged on the coil substrate, namely such that the carrier substrate of the chip module is arranged opposite of the coil and the strip conductors are contacted with the upper side of coil contact ends of the coil, the carrier substrate of the chip carrier serving as an insulating separation layer between the strip conductors and the coil.

6. The chip card module according to claim 4 or 5, characterized in that the chip module is arranged on the coil module in such a way that the chip carrier with its strip conductors transversely extends over a winding section of the coil and the outer contact ends of the strip conductors are respectively contacted with one inner and one outer coil contact end.

7. A method for producing a chip card module that comprises a chip module with a chip carrier that is arranged on a flexible carrier substrate and contains strip conductors that are contacted with a chip, as well as a chip module with a coil that is arranged on a coil substrate, wherein the chip module and the coil module are arranged on top of one another in a first production step in such a way that an insulating separation layer is arranged between the strip conductors and the coil and wherein the contact ends of the strip conductors pressed against coil contact ends while being subjected to temperature in an ensuing production step, characterized in that two identically long longitudinal regions of the chip carrier which arranged offset relative to one another in the longitudinal direction of the chip carrier and respectively assigned to one strip conductor are moved into a position in which they are situated congruently with the coil contact ends of the coil in the first production step, and in that the strip conductors are contacted in the ensuing production step while simultaneously displacing the separation layer that is formed by the carrier substrate or the coil substrate and arranged between the contact ends of the strip conductors and the coil contact ends, wherein the chip carrier and the carrier substrate have an essentially Z-shaped design with a chip contact region formed in a central area and with the longitudinal regions respectively extending to one side of a central axis and transforming into one another in a central area forming the chip contact region.

8. The method according to claim 7, characterized in that the separation layer is formed by the coil substrate, and in that the rear side of the contact ends of the strip conductors is subjected to pressure by means of the carrier substrate while simultaneously compressing the carrier substrate in a contact zone.

* * * * *